FREQUENCY CHANGER WITH SYNC INPUT AND SYNC POTENTIAL CONTROLS

Filed Oct. 3, 1963

2 Sheets-Sheet 1

INVENTOR.
Jerome P. Friedrichs
Robert J. Munn
BY Mueller & Aichele
Attys.

Nov. 9, 1965 J. P. FRIEDRICHS ETAL 3,217,270

FREQUENCY CHANGER WITH SYNC INPUT AND SYNC POTENTIAL CONTROLS

Filed Oct. 3, 1963 2 Sheets-Sheet 2

INVENTORS
Jerome P. Friedrichs
Robert J. Munn.
BY Mueller & Aichele
Attys.

3,217,270

FREQUENCY CHANGER WITH SYNC INPUT AND SYNC POTENTIAL CONTROLS

Jerome P. Friedrichs, Des Plaines, and Robert J. Munn, Hillside, Ill., assignors to Motorola, Inc., Franklin Park, Ill., a corporation of Illinois Filed Oct. 3, 1963, Ser. No. 313,474
11 Claims. (Cl. 331—173)

This invention relates to frequency changers and in particular to frequency changers in which the output frequency of an oscillator is synchronized by an input frequency signal which is an integral multiple or submultiple of the output frequency.

In many electronic devices it is required that a frequency which is an exact harmonic or subharmonic of an available frequency be generated. A standard practice is to use a locked oscillator circuit in which an oscillator is synchronized at a harmonic or subharmonic frequency of the available frequency. In certain applications it is also important that there be no output from the frequency changer if there is no input. Regenerative and digital dividers meet this requirement but they are complex and their adjustment is critical, particularly for large division ratios. Frequency multipliers also meet this requirement but produce an output frequency spectrum which is undesirable. Locked oscillators are simple in operation and construction, but since removal of the input synchronizing frequency results in a free running oscillator with an output of a random or undesired frequency, they are not suitable in many applications.

It is therefore an object of this invention to provide a frequency changer of the locked oscillator type which will not have an output frequency in the absence of an input frequency.

Another object of this invention is to provide a circuit having locked oscillator frequency changers coupled in series for large changes in frequency and in which the removal of an input to any of the oscillators in the series will result in a cessation of output signals.

A feature of this invention is the provision of a locked oscillator frequency changer circuit including a detector responsive to the input signal to the divider, and a switch responsive to the detector to disconnect the oscillator from its power supply in the absence of an input signal.

Another feature of this invention is the provision of a locked oscillator frequency changer circuit including a chain of series connected oscillators each having a detector responsive to its input signal and a plurality of switches connected in series each responsive to a different detector to disconnect the output oscillator in the chain from its power supply in the absence of an input signal to any of the oscillators in the chain. The oscillators in the chain may be multipliers, dividers, or a combination of multipliers and dividers.

The invention is illustrated in the drawings in which.

In practicing this invention a frequency changer of the locked oscillator type is synchronized by an alternating current signal applied to its input, at a harmonic or subharmonic of the frequency of the input signal. The frequency changer is coupled to a power supply through a switch. A detector is coupled to the input of the frequency changer and to the switch and is responsive to the input signal to develop a control voltage, when an input signal is present, which will close the switch, thus connecting the frequency changer to its power supply and causing it to become operative.

Several frequency changers may be coupled in series with each frequency changer having a detector coupled to its input. Switches are coupled in series between the power supply and the output frequency changer in the chain, each switch being controlled by a detector responsive to the signal applied to the input of a different frequency changer. Thus an input failure in any portion of the frequency changer chain will cause the last frequency changer in the chain to become inoperative. The frequency changers may all be multipliers or dividers in order to achieve a larger frequency change than would be feasible with one frequency changer, or they may be a combination of multipliers and dividers to produce a fractional multiple of the input frequency.

Figure 1:
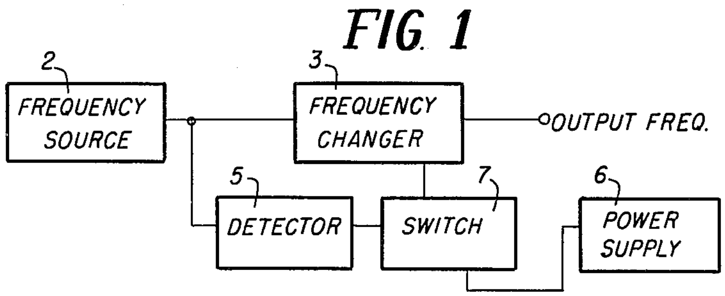
FIG. 1 is a block diagram of the frequency changer system of this invention.

Referring to FIG. 1, a source of alternating current 2 is coupled to a frequency changer 3 of the locked oscillator type. This frequency changer may act as a frequency multiplier or divider. The input frequency from the frequency source 2 may be developed from a highly stable crystal controlled oscillator enclosed in a proportional oven for temperature stabilization and, for example, may have an output frequency of 3 megacycles. This frequency is applied to the frequency changer 3.

The frequency changer 3 may be a frequency divider which may, for example, have a frequency division ratio of 5. In this case the output frequency would be 600 kilocycles. Frequency changer 3 may also be used as a frequency multiplier having, for example, a multiplication ratio of 5. In this case the output frequency would be 15 megacycles. The input frequency of 3 megacycles is used to synchronize the frequency changer so that the output frequency has the same order of accuracy and stability as the input frequency of 3 megacycles.

The input signal is also coupled to a detector 5 which develops a control voltage in response to the applied signal. A power supply 6 is coupled to the frequency changer 3 by a switch 7 which is normally open thus disconnecting the power supply from the frequency changer causing it to be inoperative. Switch 7 closes in response to the control voltage developed by detector 5, thereby connecting the power supply 6 to the frequency changer 3. In the absence of an input signal to the frequency changer 3, switch 7 will remove the power supply voltage from the frequency changer and cause it to be inoperative. Thus the frequency changer 3 will develop an output signal only when there is an input frequency applied thereto.

Figure 2:
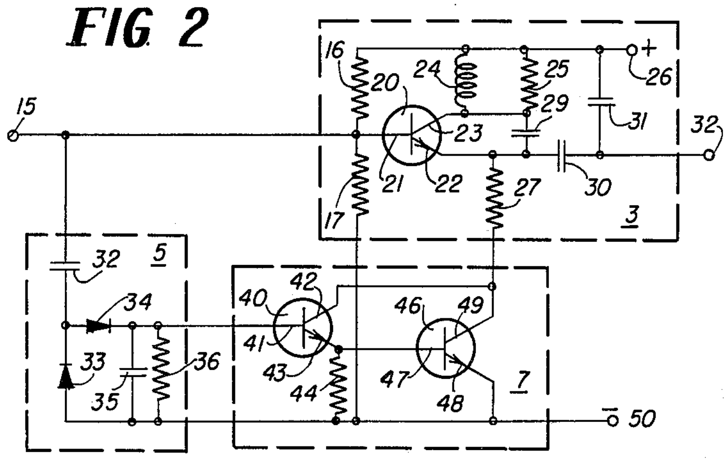
FIG. 2 is a schematic diagram of the system shown in FIG. 1 using a locked oscillator as the frequency changer.

FIG. 2 is a schematic diagram of the system illustrated in FIG. 1 and similar portions have the same identifying numbers. Frequency changer 3 is a free running oscillator tuned to a frequency close to the desired output frequency, which is an harmonic or subharmonic of the input frequency. A tank circuit, consisting of variable inductor 24 and capacitors 29, 30 and 31 coupled to the collector 23 of transistor 20, determines the output frequency of the free running oscillator. Thus the oscillator may function as a divider or multiplier depending upon the frequency to which it is tuned as a free running oscillator.

Terminal 26 is coupled to one terminal of the power supply and a supply voltage is applied to collector 23 through the inductor 24 and resistor 25. Resistors 16 and 17 provide a bias voltage for the base 21 of transistor 20. Resistor 27 is coupled to the other terminal of the power supply through switch 7. The output harmonic or subharmonic frequency is applied to terminal 32 from the junction of capacitors 30 and 31. Positive feedback is applied from the collector 23 of the transistor stage 20 to the emitter 21 from the junction of capacitors 29 and 30.

In operation, with switch 7 closed, oscillator 3 will oscillate at a frequency near the desired output frequency. A synchronizing signal having a frequency which is an integral multiple or submultiple of the desired output frequency is applied to terminal 15 and is coupled from this terminal to the base 21 of transistor 20 of oscillator 3. The signal applied to terminal 15 acts on the oscillator 3 to synchronize the oscillator so that its frequency will be a harmonic or subharmonic of the input frequency as desired. The input signal is also coupled to a detector circuit 5 through capacitor 32. The input frequency is detected by the half-wave rectifier consisting of diodes 33 and 34 and applied across filter capacitor 35 and bleeder resistor 36. The direct current output voltage of the detector 5 is applied to the base 41 of transistor 40. Transistor 40 and resistor 44 coupled to the emitter 43 form an emitter follower circuit which amplifies the signal applied to transistor 40. The amplifier signal is applied to the base 47 of transistor 46, which acts as a switch, and is biased so that it will conduct when an input signal is applied to the detector 5. The other terminal of the power supply for the oscillator 3 is coupled to the oscillator through the emitter 48 and collector 49 of transistor 46. With this transistor biased in the conducting condition, oscillator 3 receives a voltage sufficient to cause it to operate normally. In the absence of an input signal applied to detector 5, transistors 40 and 46 are biased so that they are nonconducting thus preventing any power from reaching oscillator 3.

Figure 3:
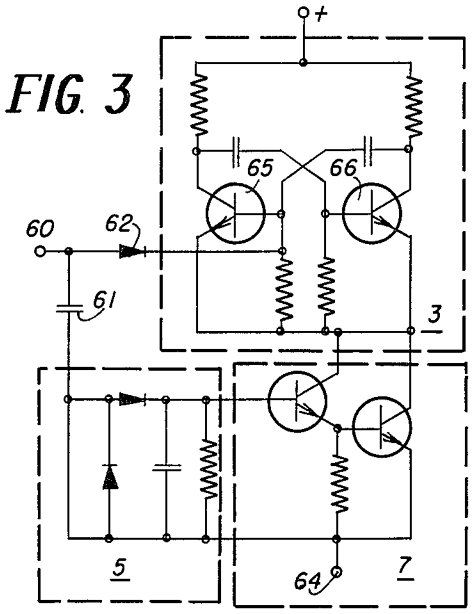
FIG. 3 is a schematic diagram of the system shown in FIG. 1 using a locked relaxation oscillator as the frequency changer.

FIG. 3 illustrates an embodiment of the invention using a relaxation oscillator as the frequency changer. Transistors 65 and 66 are coupled together to form a multivibrator oscillator circuit 3 well known in the art. The detector circuit 5 and the switch circuit 7 of FIG. 3 are identical in design and operation to those described in the explanation of FIG. 2. In operation the multivibrator frequency changer 3 is designed to oscillate at a frequency slightly below the desired output frequency. A triggering signal having a frequency that is an integral multiple or submultiple of the desired output frequency is applied to terminal 60. This signal is coupled to the oscillator 3 through diode 62 and synchronizes oscillator 3 at a harmonic or a subharmonic of the input frequency. The input signal is also coupled to detector 5 through capacitor 61. Detector 5 develops a control voltage as previously described and applies this control voltage to switch 7. A power supply voltage is coupled from terminal 64 to the oscillator 3 through switch 7. When a control voltage is applied to switch 7 the transistors are biased to conduction thereby connecting the power supply to the oscillator 3.

Figure 4:
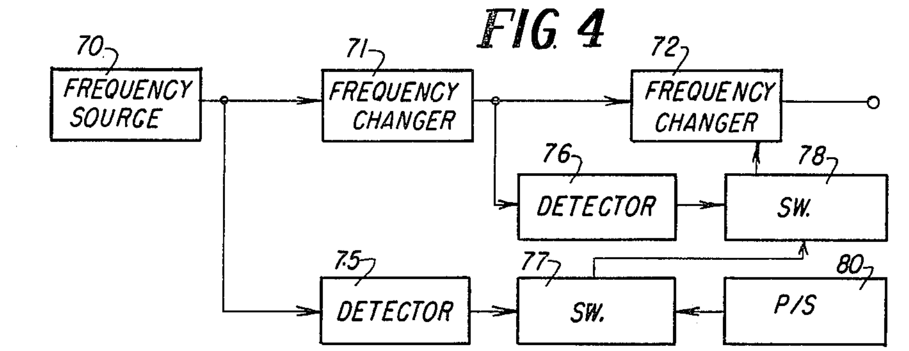
FIG. 4 is a block diagram of another embodiment of the frequency changer system of this invention in which a plurality of frequency changers are used.

FIG. 4 is a block diagram showing a system incorporating two frequency changers connected in series for obtaining a greater frequency change than is possible with one changer. The system is not limited to two frequency changers, however, and this is given by way of example. One of the frequency changers may act as a multiplier and the other as a divider. For example frequency changer 71 may multiply by 5 and frequency changer 72 may divide by 3. In this example the output frequency would be 5/3 of the input frequency.

A signal from a source of alternating current 70 is applied to a frequency changer 71. The harmonic or subharmonic output frequency of frequency changer 71 is further changed in frequency changer 72. The input to frequency changer 71 is applied to detector 75 and the input to frequency changer 72 is applied to detector 76. Detectors 75 and 76 are coupled to switches 77 and 78 respectively which are connected in series and couple the power supply 80 to the last frequency changer 72 in the chain.

Detectors 75 and 76 are responsive to the input signals applied to frequency changers 71 and 72 to develop an output voltage when a signal is present at the input of the frequency changer to which the particular detector is connected. The voltages developed by the detectors are applied to switches 77 and 78 causing them to close. When a signal is present at the input to frequency changers 71 and 72, both switches 77 and 78 are closed and power supply 80 is connected to frequency changer 72. If there is no signal present at the input of either of the frequency changers 71 or 72, the switch coupled to that frequency changer by a detector will be opened and the last frequency changer in the chain 72 will not receive power from power supply 80. Thus there will be no output from the frequency changer chain unless there is an input to each of the frequency changers in the chain.

Figure 5:
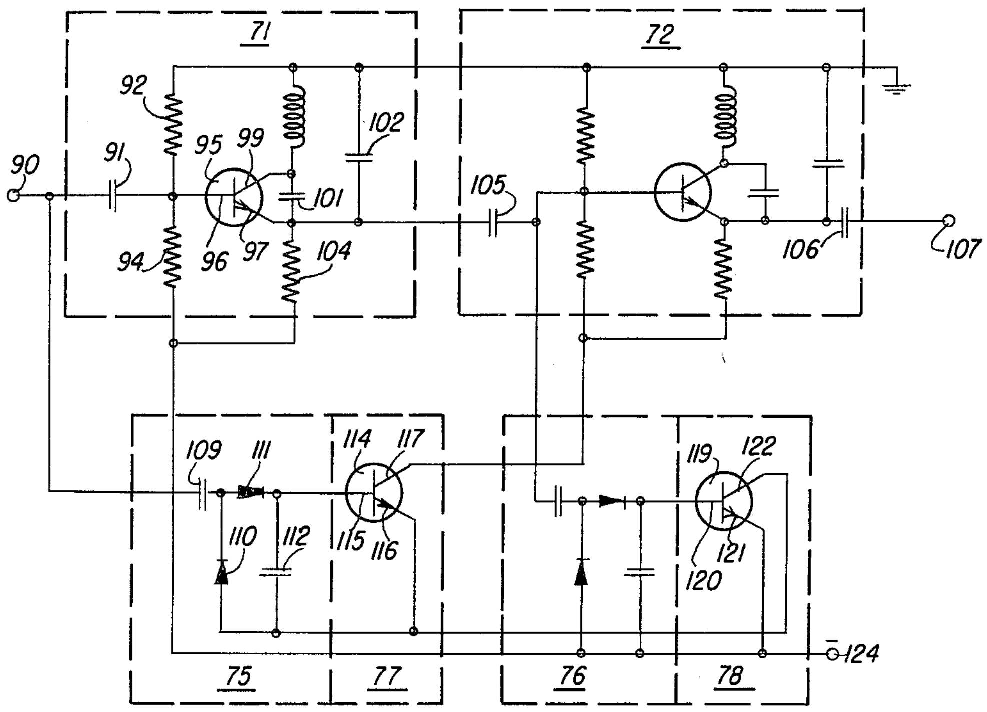
FIG. 5 is a schematic diagram of the system shown in FIG. 4 using two locked oscillators as frequency changers.

FIG. 5 is a schematic diagram showing one form of the system illustrated in FIG. 4. Elements of FIG. 5 have the same numbers as the corresponding elements of FIG. 4. Frequency changer 71 is a free running oscillator tuned to a frequency close to the desired output frequency. A tank circuit consisting of inductor 100 and capacitors 101 and 102 is coupled to the collector 99 of transistor 95 and determines the free running oscillation frequency. Bias resistors 92 and 94 provide a bias potential for transistor 95 and are connected to the base 96. The emitter 97 is connected to a power supply potential through resistor 104. The input synchronizing signal is applied from terminal 90 to the base 96 of transistor 95 through coupling capacitor 91.

The output signal from frequency changer 71 is coupled to frequency changer 72 through coupling capacitor 105. Frequency changer 72 is similar in operation to frequency changer 71 and the transistor 108 is connected in an oscillator circuit as has been described. The output of frequency changer 72 is coupled to output terminal 107 through capacitor 106.

The input frequency to frequency changer 71 is also coupled to detector 75 which includes coupling capacitor 109, diodes 110 and 111 and a filter capacitor 112. The detector thus acts as a half-wave rectifier for the alternating current signal applied thereto. The direct current signal developed by detector 75 is applied to switch 77 which consists of a transistor 114.

Detector 76 is coupled to the input of frequency changer 72 and operates in the same manner as detector 75. The voltage developed by detector 76, when a signal is present at the input of frequency changer 72, is applied to the base 120 of transistor 119. Transistor 119 is connected between the power supply and the emitter of transistor 114. The power supply for frequency changer 72 is thus connected thereto through transistors 119 and 114. The voltages applied to the bases 115 and 120 of transistors 114 and 119, when a signal is present at the input of frequency changers 71 and 72, is of the proper polarity to bias transistors 114 and 119 so that they conduct. When a signal is not present at the input of either of the dividers 71 or 72 the bias voltage applied to the corresponding switches 77 and 78 is no longer present and that particular transistor is biased to non-conduction. This blocks the supply voltage to the output frequency changer 72 and this frequency changer becomes inoperative.

Thus, a frequency changing circuit has been shown in which a switch, sensitive to the input signal applied to a frequency changer, acts to prevent operation of the frequency changer when the input signal is not present. The frequency changer can be a frequency multiplier or a frequency divider and can develop an output frequency which is an integral multiple or submultiple of the input frequency. The circuit is simple and is not critical of adjustment, and has been found to be very satisfactory in actual use.

We claim:

1. A frequency changing system including, in combination, frequency changer means adapted to be coupled to a source of alternating current signals, said frequency changer means being responsive to said signals to develop an output frequency different from said signals, power supply means, switch means coupling said power supply means to said frequency changer means, detector means coupled to said frequency changer means and responsive to signals applied to said frequency changer means to develop a control voltage, means coupling said detector means to said switch means for applying said control voltage thereto, said switch means being responsive to said control voltage to couple said power supply means to said frequency changer means to thereby render said frequency changer means operative.

2. A frequency changing circuit including, in combination, frequency changer means adapted to be coupled to a source of alternating current signals, said frequency changer means being responsive to said signals to develop an output frequency having a harmonic frequency relationship with said alternating current signals, power supply means, switch means coupling said power supply means to said frequency changer means, detector means coupled to said frequency changer means and responsive to signals applied to said frequency changer means to develop a control voltage, means coupling said detector means to said switch means for applying said control voltage thereto, said switch means being responsive to said control voltage to couple said power supply means to said frequency changer means to thereby render said frequency changer means operative.

3. A frequency changing circuit including, in combination, a plurality of frequency changer means connected in series and including an output frequency changer means, each of said frequency changer means being adapted to be coupled to a supply of alternating current signals and responsive to said signals to develop an output frequency having a harmonic frequency relationship therewith, power supply means, a plurality of switch means series connected between said power supply means and said output frequency changer means, a plurality of detector means each coupled to a different one of said frequency changer means each of said detector means being responsive to signals applied to the associated frequency changer means to develop a control voltage, means coupling said detector means to said switch means for applying said control voltages thereto, said switch means being responsive to said control voltages to couple said power supply means to said output frequency changer means to thereby render said output frequency changer means operative.

4. A frequency changing circuit including, in combination, oscillator means having an input adapted to be coupled to a source of alternating current signals, said oscillator means being responsive to said signals to develop an output signal having a harmonic frequency relationship with said alternating current signal, power supply means, switch means coupling said power supply means to said oscillator means for rendering said oscillator means operative, detector means coupled to said input and responsive to said alternating current signals to develop a control voltage when said alternating current signals are applied to said oscillator means, means coupling said detector means to said switch means for applying said control voltage thereto, said switch means being responsive to said control voltage to couple said power supply means to said oscillator means.

5. A frequency changing circuit including, in combination, locked oscillator means having an input adapted to be coupled to a source of alternating current signals, said oscillator means being responsive to said signals to develop an output signal having a harmonic frequency relationship with said alternating current signals, power supply means, transistor switch means coupling said power supply means to said oscillator means, rectifier circuit means coupled to said input and responsive to said alternating current signals to develop a direct current control voltage when said alternating current signals are applied to said oscillator means, means coupling said rectifier circuit means to said switch means for applying said control voltage thereto, said transistor switch means being responsive to said control voltage to couple said power supply means to said oscillator means to render said oscillator means operative.

6. A frequency changing circuit including, in combination, relaxation oscillator means having an input adapted to be coupled to a source of alternating current signals, said relaxation oscillator means being responsive to said signals to develop an output signal having a harmonic frequency relationship with said alternating current signals, power supply means, transistor switch means coupling said power supply means to said relaxation oscillator means, rectifier circuit means coupled to said input and responsive to said alternating current signals to develop a direct current control voltage when said alternating current signals are applied to said relaxation oscillator means, means coupling said rectifier circuit means to said transistor switch means for applying said control voltage thereto, said transistor switch means being responsive to said control voltage to couple said power supply means to said relaxation oscillator means to render said relaxation oscillator means operative.

7. A frequency changing circuit including in combination, first and second oscillator means connected in series and having first and second input circuits respectively, each of said oscillator means being responsive to input signals applied to said first and second input circuits to develop an output signal having a harmonic frequency relationship with said input signals, power supply means coupled to said first oscillator means, first and second detector means coupled to said first and second input circuits respectively, said detector means being responsive to said input signals to develop control voltages therefrom, first and second switch means series connected between said power supply and said second oscillator means, said first and second detector means being coupled to said first and second switch means respectively for applying said control voltages thereto, said switch means being responsive to said control voltages to couple said power supply to said second oscillator means to render the same operative in response to a signal at each of said input circuits.

8. A frequency divider circuit including in combination, divider means adapted to be coupled to a source of alternating current signals, said divider means being responsive to said signals to develop a subharmonic frequency thereof, power supply means, switch means coupling said power supply means to said divider means for rendering said divider means operative, detector means coupled to said divider means and responsive to said alternating current signals to develop a control voltage when said alternating current signals are applied to said divider means, means coupling said detector means to said switch means for applying said control voltage thereto, said switch means being responsive to said control voltage to couple said power supply means to said divider means.

9. A frequency divider circuits for generating a subharmonic frequency of alternating current signals applied thereto and including in combination, a plurality of divider means connected in series and including an output divider means, each of said plurality of divider means being responsive to said signals to develop a subharmonic frequency thereof, power supply means, a plurality of switch means series connected between said power supply means and said output divider means, a plurality of detector means, each of said divider means having a different one of said detector means coupled thereto, each of said plurality of detector means being responsive to the signals applied to said associated divider means to develop control voltages therefrom, each of said detector means being coupled to a different one of said switch means for applying said control voltages thereto, said plurality of switch means being responsive to said control voltages to couple said power supply means to said output divider means when a signal is present at each of said divider means to render said output divider means operative.

10. A frequency multiplier circuit including in combination, multiplier means adapted to be coupled to a source of alternating current signals, said multiplier means being responsive to said signals to develop a harmonic frequency thereof, power supply means, switch means coupling said power supply means to said multiplier means for rendering said multiplier means operative, detector means coupled to said multiplier means and responsive to said alternating current signals to develop a control voltage when said alternating current signals are applied to said mulitplier means, means coupling said detector means to said switch means for applying said control voltage thereto, said switch means being responsive to said control voltage to couple said power supply means to said multiplier means.

11. A frequency multiplier circuit for generating a harmonic frequency of alternating current signals applied thereto and including in combination, a plurality of multiplier means connected in series and including an output multiplier means, each of said plurality of multiplier means being responsive to said signals to develop a harmonic frequency thereof, power supply means, a plurality of switch means series connected between said power supply means and said output multiplier means, a plurality of detector means, each of said multiplier means having a different one of said detector means coupled thereto, each of said plurality of detector means being responsive to the signals applied to said associated multiplier means to develop control voltages therefrom, each of said detector means being coupled to a different one of said switch means for applying said control voltages thereto, said plurality of switch means being responsive to said control voltages to couple said power supply means to said output multiplier means when a signal is present at each of said input circuits to render said output multiplier means operative.

No references cited.

ROY LAKE, *Primary Examiner.*